(12) United States Patent
Mouli

(10) Patent No.: US 7,741,660 B2
(45) Date of Patent: Jun. 22, 2010

(54) PIXEL AND IMAGER DEVICE HAVING HIGH-K DIELECTRICS IN ISOLATION STRUCTURES

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/636,564

(22) Filed: Dec. 11, 2006

(65) Prior Publication Data
US 2007/0096176 A1 May 3, 2007

Related U.S. Application Data

(63) Continuation of application No. 10/754,565, filed on Jan. 12, 2004, now Pat. No. 7,148,525.

(51) Int. Cl.
*H01L 27/148* (2006.01)
*H01L 29/768* (2006.01)

(52) U.S. Cl. .................. 257/233; 257/234; 257/291; 257/292; 257/E27.133

(58) Field of Classification Search .................. 257/232, 257/233, 234, 291, 292, E27.133
See application file for complete search history.

(56) References Cited

U.S. PATENT DOCUMENTS

| | | | |
|---|---|---|---|
| 5,241,198 A | 8/1993 | Okada et al. | |
| 5,679,597 A | 10/1997 | Moon | |
| 6,046,487 A | 4/2000 | Benedict et al. | |
| 6,225,171 B1 | 5/2001 | Yu et al. | |
| 6,570,222 B2 | 5/2003 | Nozaki et al. | |
| 6,642,087 B2 | 11/2003 | Nozaki et al. | |
| 6,794,698 B1 | 9/2004 | Perng et al. | |
| 6,803,581 B2 | 10/2004 | Prince et al. | |
| 7,201,174 B2 | 4/2007 | Fukiage | |
| 7,235,835 B2 | 6/2007 | Nagano et al. | |
| 2001/0025970 A1 | 10/2001 | Nozaki et al. | |
| 2002/0117731 A1 | 8/2002 | Kim et al. | |
| 2003/0201479 A1 | 10/2003 | Birner et al. | |
| 2004/0011379 A1 | 1/2004 | Anaokar et al. | |
| 2004/0021751 A1 | 2/2004 | Ohno | |
| 2004/0146655 A1 | 7/2004 | Seidl et al. | |
| 2004/0178430 A1* | 9/2004 | Rhodes et al. | 257/292 |
| 2004/0232494 A1 | 11/2004 | Nagano et al. | |
| 2005/0042793 A1 | 2/2005 | Mouli et al. | |

(Continued)

OTHER PUBLICATIONS

S. G. Sazonov et al., "Charge properties of aluminum oxide layers synthesized by molecular layering," Technical Physics Letters, vol. 24, No. 7, Jul. 1998, pp. 525 and 526.

(Continued)

*Primary Examiner*—Thien F Tran
(74) *Attorney, Agent, or Firm*—Dickstein Shapiro LLP

(57) ABSTRACT

An imager device that has an isolation structure such that pinned photodiode characteristics are maintained without increasing doping levels. The invention provides an isolation structure to maintain pinned photodiode characteristics without increasing doping levels around the photodiode. By creating a substrate region surrounding the charge-collection region of the photodiode, the photodiode may be electrically isolated from the bulk substrate. This region fixes the depletion region so that it does not migrate toward the surface of the substrate or the STI region. By doing so, the region prevents charge from being depleted from the substrate and the accumulation region, reducing dark current.

18 Claims, 14 Drawing Sheets

U.S. PATENT DOCUMENTS

2005/0116275 A1  6/2005  Lin et al.
2005/0285154 A1  12/2005  Akram et al.
2006/0289252 A1  12/2006  Spina
2007/0170541 A1  7/2007  Chui et al.

OTHER PUBLICATIONS

N. Novkovski, "Breakdown and generation of interface states in oxynitride thin films on silicon," Semicond. Sci. Technol. 17, No. 2, Jan. 10, 2002, pp. 93-96.

* cited by examiner

PIXEL AND IMAGER DEVICE HAVING HIGH-K DIELECTRICS IN ISOLATION STRUCTURES

CROSS-REFERENCE TO RELATED APPLICATION

The present application is a continuation application of U.S. patent application Ser. No. 10/754,565, filed on Jan. 12, 2004 now U.S. Pat. No. 7,148,525, the disclosure of which is incorporated herein by reference in its entirety.

FIELD OF THE INVENTION

The invention relates to the field of semiconductor devices and, in particular, to a pixel cell using a high-k dielectric film to create a strong accumulation region for providing isolation and optimizing characteristics of the cell.

BACKGROUND OF THE INVENTION

A CMOS imager circuit includes a focal plane array of pixel cells, each cell includes a photosensor, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion node, connected to the gate of the source follower transistor. Charge generated by the photosensor is sent to the floating diffusion region. The imager may also include a transistor for transferring charge from the photosensor to the floating diffusion node and another transistor for resetting the floating diffusion region node to a predetermined charge level prior to charge transference. Each pixel cell is isolated from other pixel cells in the array by a field oxide region (STI), which surrounds it and separates the doped regions of the substrate within that pixel cell from the doped regions of the substrate within neighboring pixel cells.

In a CMOS imager, the active elements of a pixel cell, for example a four transistor pixel, perform the necessary functions of (1) photon to charge conversion; (2) transfer of charge to the floating diffusion node; (3) resetting the floating diffusion node to a known state before the transfer of charge to it; (4) selection of a pixel cell for readout; and (5) output and amplification of a signal representing a reset voltage and a pixel signal voltage based on the photo converted charges. The charge at the floating diffusion node is converted to a pixel output voltage by a source follower output transistor.

FIG. 1 illustrates a block diagram of a CMOS imager device 100 having a pixel array 110 with each pixel cell being constructed as described above. Pixel array 110 comprises a plurality of pixels arranged in a predetermined number of columns and rows (not shown). The pixels of each row in array 110 are all turned on at the same time by a row select line, and the pixels of each column are selectively output by respective column select lines. A plurality of row and column lines are provided for the entire array 110. The row lines are selectively activated by the row driver 145 in response to row address decoder 155 and the column select lines are selectively activated by the column driver 160 in response to column address decoder 170. Thus, a row and column address is provided for each pixel.

The CMOS imager is operated by a control circuit 150, which controls decoders 155, 170 for selecting the appropriate row and column lines for pixel readout, and row and column driver circuitry 145, 160, which apply driving voltage to the drive transistors of the selected row and column lines. The pixel column signals, which typically include a pixel reset signal Vrst and a pixel image signal Vsig for each pixel are read by sample and hold circuitry 161, 162 associated with the column device 160. A differential signal Vrst–Vsig is produced for each pixel, which is amplified and digitized by analog-to-digital converter 175. The analog to digital converter 175 converts the analog pixel signals to digital signals which, are fed to an image processor 180 to form a digital image.

Exemplary CMOS imaging circuits, processing steps thereof, and detailed descriptions of the functions of various CMOS elements of an imaging circuit are described, for example, in U.S. Pat. Nos. 6,140,630, 6,376,868, 6,310,366, 6,326,652, 6,204,524, and 6,333,205, assigned to Micron Technology, Inc. The disclosures of each of the forgoing are hereby incorporated by reference herein in their entirety.

A schematic diagram of an exemplary CMOS four-transistor (4 T) pixel cell 10 is illustrated in FIG. 2. The four transistors include a reset transistor 34, source follower transistor 36, row select transistor 38 and a transfer gate 32. A photosensor 40 converts incident light into an electrical charge. A floating diffusion region 50 receives the charge from the photosensor 40 through the transfer gate 32 (when activated by a transfer gate control signal TG) and is connected to the reset transistor 34 and the gate of the source follower transistor 36. The source follower transistor 36 outputs a signal proportional to the charge accumulated in the floating diffusion region 50 when the row select transistor 38 is turned on. The reset transistor 34 resets the floating diffusion region 50 (when activated by a reset control signal RST) to a known potential prior to transfer of charge from the photosensor 40. The photosensor 40 may be a photodiode, photogate, or photoconductor. If a photodiode is employed, the photodiode may be formed below a surface of the substrate and may be a buried PNP photodiode, buried NPN photodiode, a buried PN photodiode, or a buried NP photodiode, among others.

In a conventional CMOS imager pixel with a buried photodiode, the photodiode converts incident light to an electrical charge. The photodiode accumulates this charge throughout the sampling period. At the end of the sampling period, the transfer gate closes (i.e., is activated) and the charge is drained from the photodiode through the transfer gate.

A buried photodiode has a shallow implant of a first conductivity (referred to herein as an accumulation region) above a deeper implant of another conductivity (referred to herein as a charge-collection region) in a substrate lightly doped with the first conductivity type. A depletion region exists at the interface between the accumulation region and the charge collection region. For example, in a p-type substrate, a shallow low-dose p-type implant is applied over an n-type photosensitive region. This also produces a dual-junction sandwich that alters the visible light spectral response (the sensitivity to optical radiation of different wavelengths) of the pixel. The upper junction is optimized for responding to lower wavelengths while the lower junction is more sensitive to the longer wavelengths.

However, the top surface of the photodiode is electrically connected to the bulk substrate via a portion of the accumulation region above the charge-collection region and a portion of the accumulation region between the field oxide region (referred to hereinafter as a STI region) and the charge-collection region. The depletion of charge from the substrate and accumulation region causes excessive leakage and creates a false signal, commonly known as "dark current." Dark current is a current that is created without photoconversion of light. Dark current may be reduced by preventing depletion of the accumulation region.

Attempts to overcome a depletion of the accumulation region have involved increasing the doping level near the STI sidewall. However, increasing the doping level near the STI sidewall creates excess leakage, which is quite significant in the overall dark current leakage level in a pinned photodiode.

Therefore, it is desirable to create an isolation structure where pinned photodiode characteristics are maintained without increased doping levels.

BRIEF SUMMARY OF THE INVENTION

The invention provides an isolation structure to maintain pinned photodiode characteristics without increasing doping levels around the photodiode. By creating a substrate region surrounding the charge-collection region of the photodiode, the photodiode may be electrically isolated from the bulk substrate. This region fixes the depletion region so that it does not migrate toward the surface of the substrate or the STI region. By doing so, the region prevents charge from being depleted from the substrate and the accumulation region, reducing dark current.

The region is achieved by depositing a high-k dielectric material on the surface of the substrate above the photodiode and on the sidewalls of the STI trench. The high-k dielectric material induces excess charge on the surface of the substrate above the photodiode and in the sidewalls of the STI region adjacent to the photodiode.

Aluminum oxide is one high-k dielectric material (a material with a dielectric constant greater than that of silicon dioxide) that induces an excess negative charge, as noted in Manchanda et al., "Si-Doped Aluminates for High Temperature Metal-Gate CMOS: Zr—Al—Si—O, A Novel Gate Dielectric for Low Power Applications," IEEE IEDM Technical Digest (2000) pp. 23-26; Lee et al., "Effect of Polysilicon Gate on the Flatband Voltage Shift and Mobility Degradation for ALD-$Al_2O_3$ Gate Dielectric," IEEE IEDM Technical Digest (2000) pp. 645-648; and Buchanan et al., "80 nm poly-silicon gated n-FETs with ultra-thin $Al_2O_3$ gate dielectric for ULSI applications," IEEE IEDM Technical Digest (2000) pp. 223-226.

Because of these properties, when using, for example, aluminum oxide (or other high-k dielectric material) to line or fill the STI regions and cover the surface of the substrate overlying a PNP photodiode, there will be an excess negative charge in the aluminum oxide layers that induces and maintains a hole-accumulation region between the aluminum oxide layer and the charge-collection region of the photodiode. Similarly, when using a high-k dielectric material in the STI trenches and on the surface of the substrate overlying an NPN photodiode, there will be an excess positive charge in the high-k dielectric material that induces and maintains an electron-rich accumulation region. By maintaining the accumulation region, the depletion region between the accumulation region and the charge-collection region is prevented from migrating toward the STI regions and the substrate surface, thereby electrically isolating the photodiode and decreasing charge leakage from the bulk substrate into the photodiode.

BRIEF DESCRIPTION OF THE DRAWINGS

Additional advantages and features of the present invention will be apparent from the following detailed description and drawings which include various embodiments of the invention, in which.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. Additionally, processing steps described and their progression are exemplary of preferred embodiments of the invention. However, the sequence of steps is not limited to that set forth herein and may be changed as is known in the art, with the exception of steps necessarily occurring in a certain order.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a photo-element unit cell containing a photosensor and transistors for converting light radiation to an electrical signal. For purposes of illustration,; a representative pixel is illustrated in the figures and description herein and, typically, fabrication of all pixels in an imager will proceed simultaneously in a similar fashion. The following detailed description is not to be taken in a limiting sense, and the scope of the present invention is defined by the appended claims.

Figure 3:
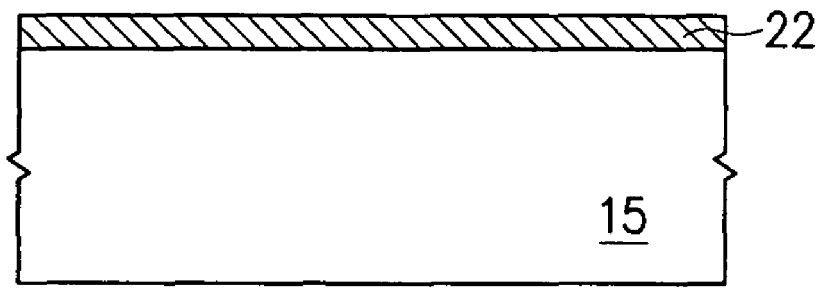
FIG. 3 a cross-section of an exemplary pixel cell of the present invention at an initial stage of fabrication.

Referring now to the drawings, where like elements are designated by like reference numerals, FIG. 3 shows a pixel cell 10 an initial stage of processing in accordance with the invention. A substrate 15 with a first conductivity is provided. For the purposes of illustration, the first conductivity type is p-type. A silicon dioxide layer 22 is grown over the surface of the substrate 15.

Figure 4:
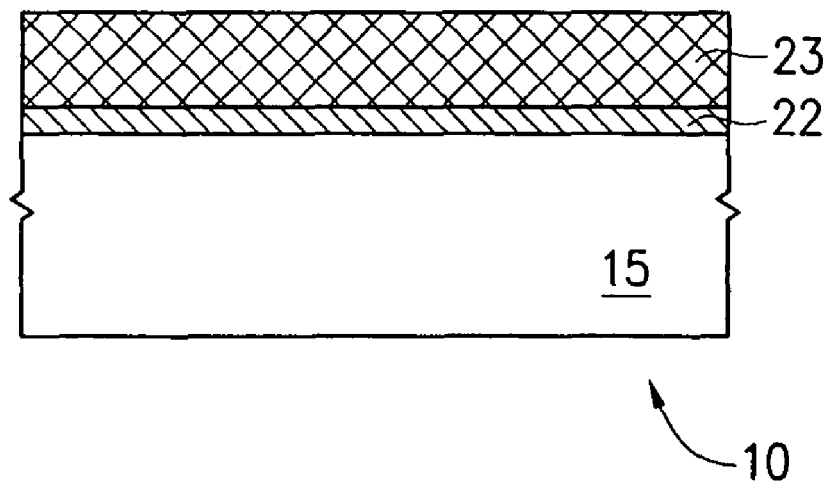
FIG. 4 is an illustration of the pixel cell of FIG. 3 at a subsequent stage of fabrication.

Referring to FIG. 4, a nitride hard mask layer 23 is deposited over the silicon dioxide layer 22. The nitride hard mask layer 23 protects the active area underneath during subsequent processing steps. The nitride hard mask layer 23 is approximately 200 Å to 1000 Å in thickness.

Figure 5:
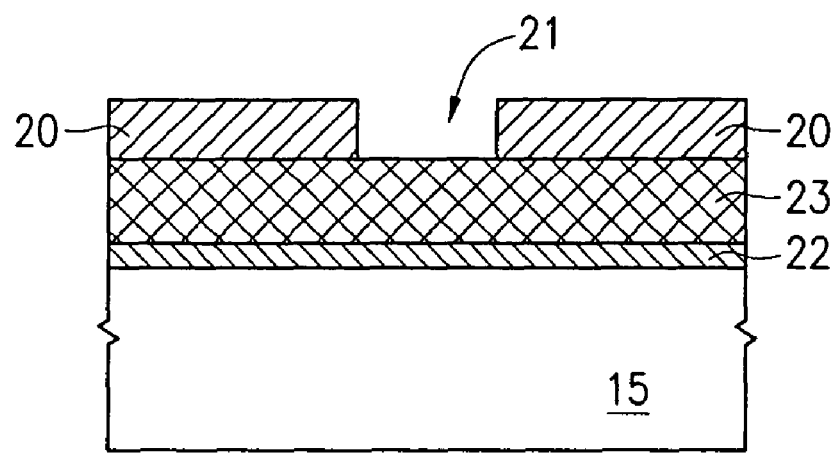
FIG. 5 is an illustration of the pixel cell of FIG. 4 at a subsequent stage of fabrication.
Figure 6:
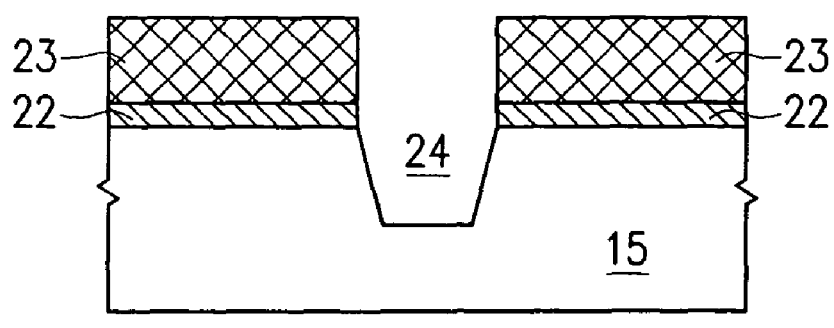
FIG. 6 is an illustration of the pixel cell of FIG. 5 at a subsequent stage of fabrication.

Referring to FIG. 5, a photoresist mask 20 is formed and patterned with an opening 21. The nitride hard mask layer and the substrate then undergo an etching process to create a trench 24, as shown in FIG. 6. In this illustration, only one trench 24 is shown. However, it should be appreciated that more than one opening and trench would be formed in a pixel cell array. Trenches of about 1,000 Å to about 4,000 Å in depth, preferably about 1,500 Å to about 3,000 Å, with a width of about 500 Å to about 10,000 Å, preferably about 1,000 Å to about 3,000 Å, are typically desired. The trench 24 is formed in the substrate 15 by anisotropic etching. The photoresist mask 20 is subsequently removed, as shown in FIG. 6.

Figure 7:
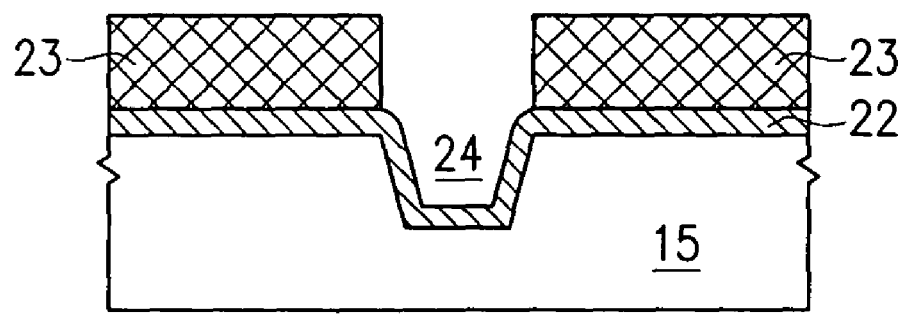
FIG. 7 is an illustration of the pixel cell of FIG. 6 at a subsequent stage of fabrication.

Referring to FIG. 7, a layer of silicon dioxide 22 is grown on the sidewalls of the trench 24 over the surface of the substrate 15. The silicon dioxide layer 22 in the trench 24 is optional and acts as a dielectric in the final structure. When the silicon dioxide layer 22 is grown as part of the final pixel cell 10, the layer 22 enhances the dielectric effects of the final structure. However, layer 22 may be removed before the next stage of fabrication. Growing a layer of silicon dioxide over a silicon substrate heals the defects in the surface of the silicon substrate, even if the silicon dioxide is subsequently removed. For the purposes of illustration, the embodiment without removing the silicon dioxide layer 22 shall be discussed herein.

Figure 8:
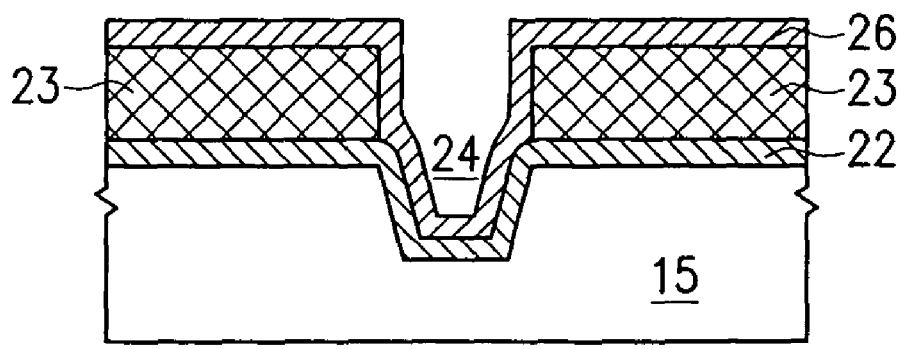
FIG. 8 is an illustration of the pixel cell of FIG. 7 at a subsequent stage of fabrication.

Referring to FIG. 8, the substrate 15 is subjected to a conformal deposition process to deposit a high-k dielectric material such as, e.g., a thin aluminum oxide liner layer 26 over the silicon dioxide layer 22 on the surface of the substrate 15 and over the walls of the trench 24. Although aluminum oxide is the material used in the present embodiment, any material with a high-k dielectric constant that induces excess negative charge is suitable for this embodiment. Materials such as aluminum nitride, silicon-rich aluminum oxides, and others are also suitable. Methods such as chemical vapor deposition, atomic layer deposition, plasma vapor deposition, or other suitable techniques may be employed in forming the aluminum oxide layer 26. The aluminum oxide layer 26 is deposited to a thickness within the range of 30 Å and 500 Å, and preferably about 50 Å.

Figure 9:
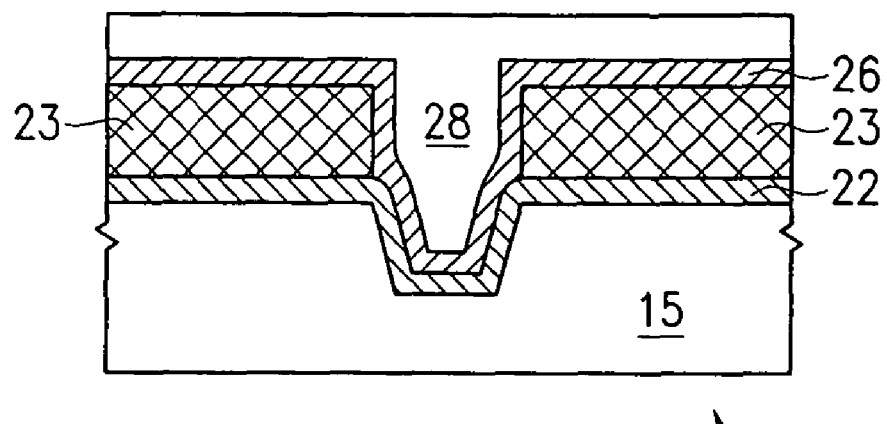
FIG. 9 is an illustration of the pixel cell of FIG. 8 at a subsequent stage of fabrication.
Figure 10A:
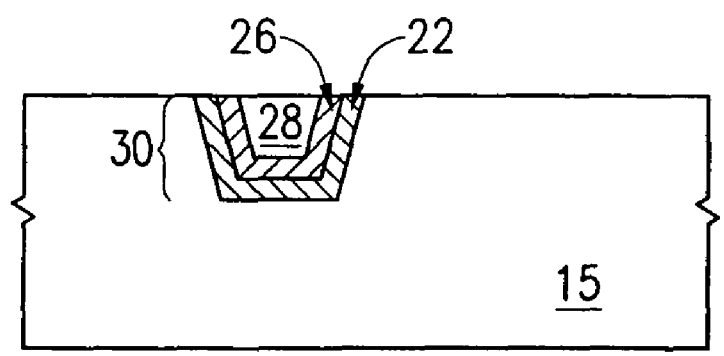
FIG. 10a is an illustration of the pixel cell of FIG. 9 at a subsequent stage of fabrication.

Referring to FIG. 9, an insulating layer 28 of dielectric material is deposited over the aluminum oxide layer 26, filling the trench 24. The insulating layer 28 may consist of an insulating material such as silicon dioxide, silicon nitride, oxide-nitride, nitride-oxide, oxide-nitride-oxide, or other suitable insulating material. This material is deposited within the trench 24 by chemical vapor deposition, low pressure chemical vapor deposition, or other suitable techniques. As shown in FIG. 10a, the substrate 15 is then planarized, removing excess insulating layer 28, aluminum oxide layer 26, and silicon dioxide layer 22 above the surface of the substrate 15. Chemical mechanical polishing or RIE dry etching processes may be employed to achieve the resulting lined STI region 30.

Figure 10B:
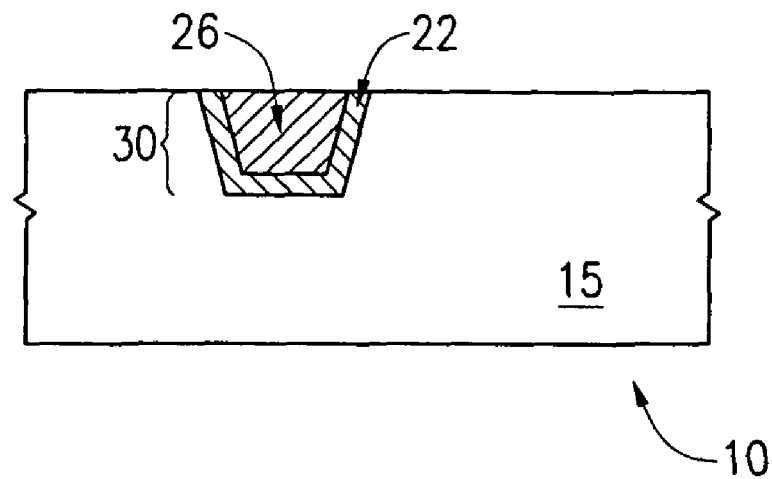
FIG. 10b is an illustration of the pixel cell of FIG. 7 at an alternative subsequent stage of fabrication.
Figure 10C:
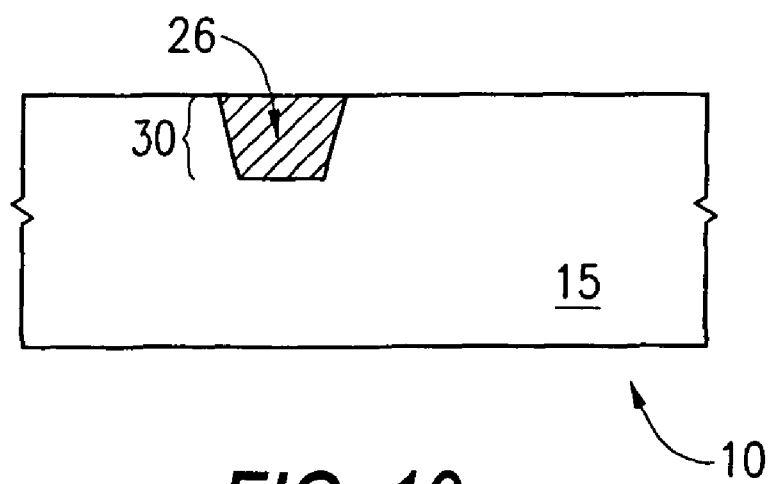
FIG. 10c is an illustration of the pixel cell of FIG. 7 at an alternative subsequent stage of fabrication.

Alternatively, FIG. 10b illustrates an embodiment where the aluminum oxide layer 26 entirely fills the trench 24 instead of using an insulating layer 28, such that the resulting STI region 30, uses aluminum oxide as the insulating material. By eliminating the step of depositing a separate dielectric layer 28, this alternative offers additional processing simplicity. A further alternative, where the silicon dioxide layer 22 is removed prior to deposition of aluminum oxide layer 26, is shown in FIG. 10c. For the purposes of illustration, the embodiment having an STI region 30 with a silicon dioxide layer 22, an aluminum oxide layer 26, and insulating layer 28 (FIG. 10a) shall be discussed herein. However, the following steps may also be performed on the FIG. 10b and 10c embodiments.

Figure 11A:
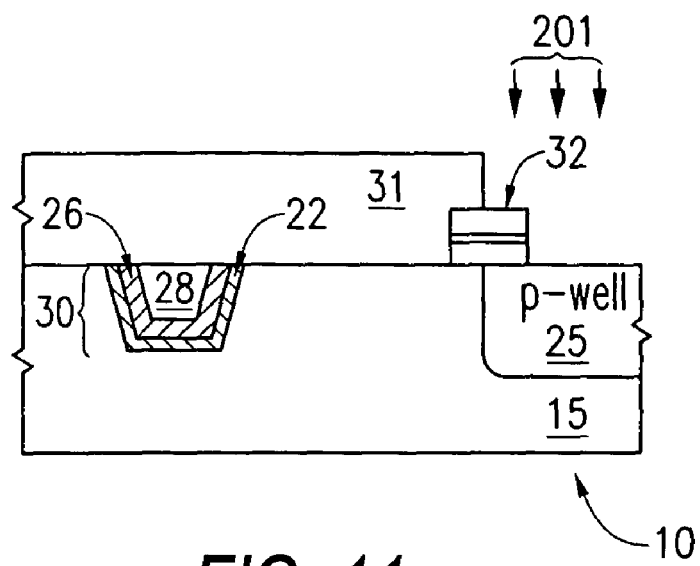
FIG. 11a is an illustration of the pixel cell of FIG. 10a at a subsequent stage of fabrication.
Figure 11B:
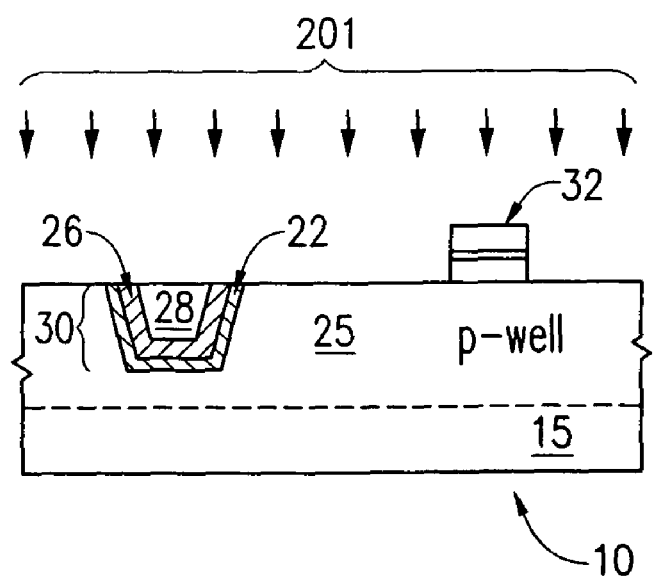
FIG. 11b is an illustration of the pixel cell of FIG. 10a at an alternative subsequent stage of fabrication.

Referring to FIGS. 11a and 11b, the desired gate stacks, such as the stacks for transfer gate 32, are layered, masked, and etched over the surface of the substrate 15. A photoresist 31 is formed over the substrate 15 and patterned to partially overlap the gate stack of the transfer gate 32, as shown in FIG. 11a. A dopant implant 201 of a first conductivity type (i.e., p-type) is performed on the substrate 15, forming a p-type well 25 region having p-type ions (e.g., boron) beneath the active area of the pixel 10. Alternatively, as shown in FIG. 11b, the dopant implant 201 may be performed without photoresist 31 and can form a blanket p-well 25 in the substrate 15. For discussion purposes only, the FIG. 11a embodiment having a p-well region is used to describe the following stages.

Figure 12:
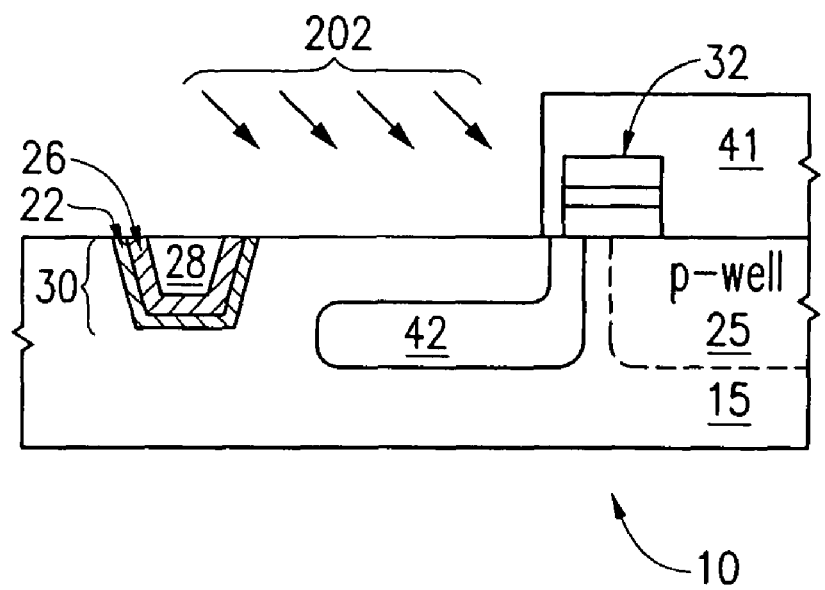
FIG. 12 is an illustration of the pixel cell of FIG. 11a at a subsequent stage of fabrication.

Next, as shown in FIG. 12, the substrate 15 is masked with photoresist 41, leaving the portion of the substrate 15 where the photodiode is to be located exposed, and an angled ion implant 202 of a second conductivity type (i.e., n-type) is performed. This implant 202 can be performed by implanting appropriate n-type ions (e.g., arsenic, antimony, phosphorous, etc.) at an energy of about 10 KeV to about 400 KeV at an implant dosage of about $3\times10^{11}$ ions/cm$^2$ to about $1\times10^{15}$ ions/cm$^2$, preferably $1\times10^{12}$ ions/cm$^2$ to about $1\times10^{14}$ ions/cm$^2$. This implant 202 forms an n-type region 42, which is the buried layer, or the charge-collection region, of the photodiode 40.

Figure 13:
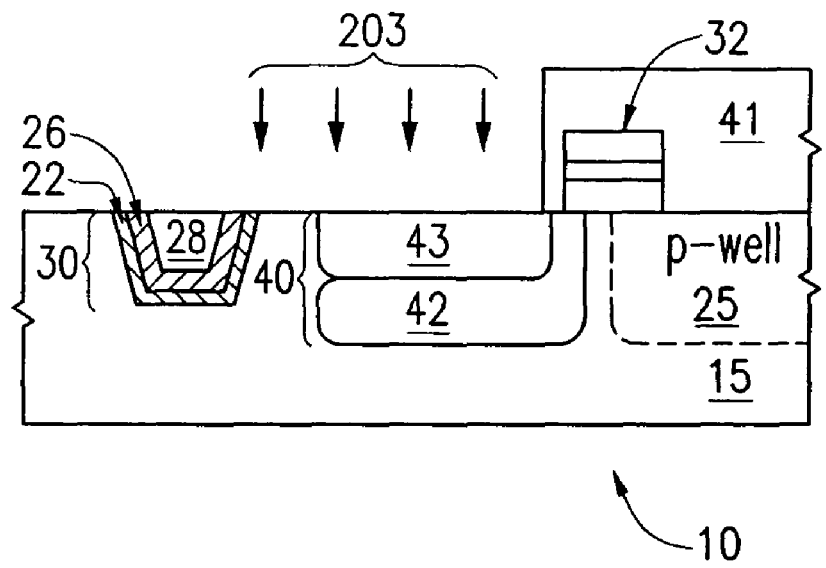
FIG. 13 is an illustration of the pixel cell of FIG. 12 at a subsequent stage of fabrication.

Referring to FIG. 13, a dopant implant 203 of a first conductivity type (i.e., p-type) is performed to form a p-type region 43 over the n-type region 42. The p-type region 43 serves as the accumulation layer of the photodiode 40, pinning the potential of the photodiode 40 to a constant value when it is fully depleted. The photoresist 41 may then be removed.

Figure 14:
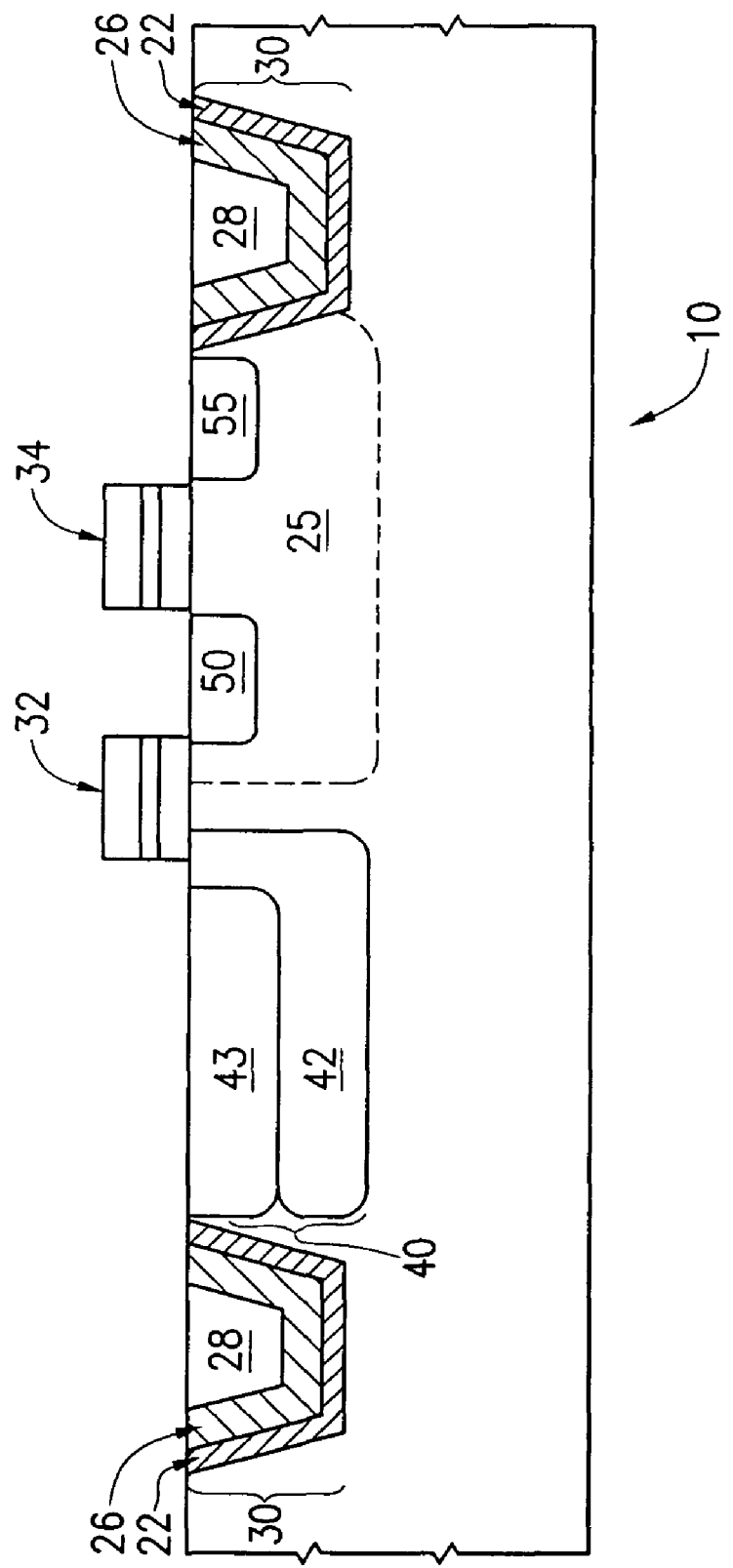
FIG. 14 is an illustration of the pixel cell of FIG. 13 at a subsequent stage of fabrication.

As shown in FIG. 14, other conventional steps of masking and doping are performed to obtain a floating diffusion region 50 between the transfer gate 32 and the reset transistor 34 and a source/drain region 55 adjacent to the reset transistor 34.

Figure 15:
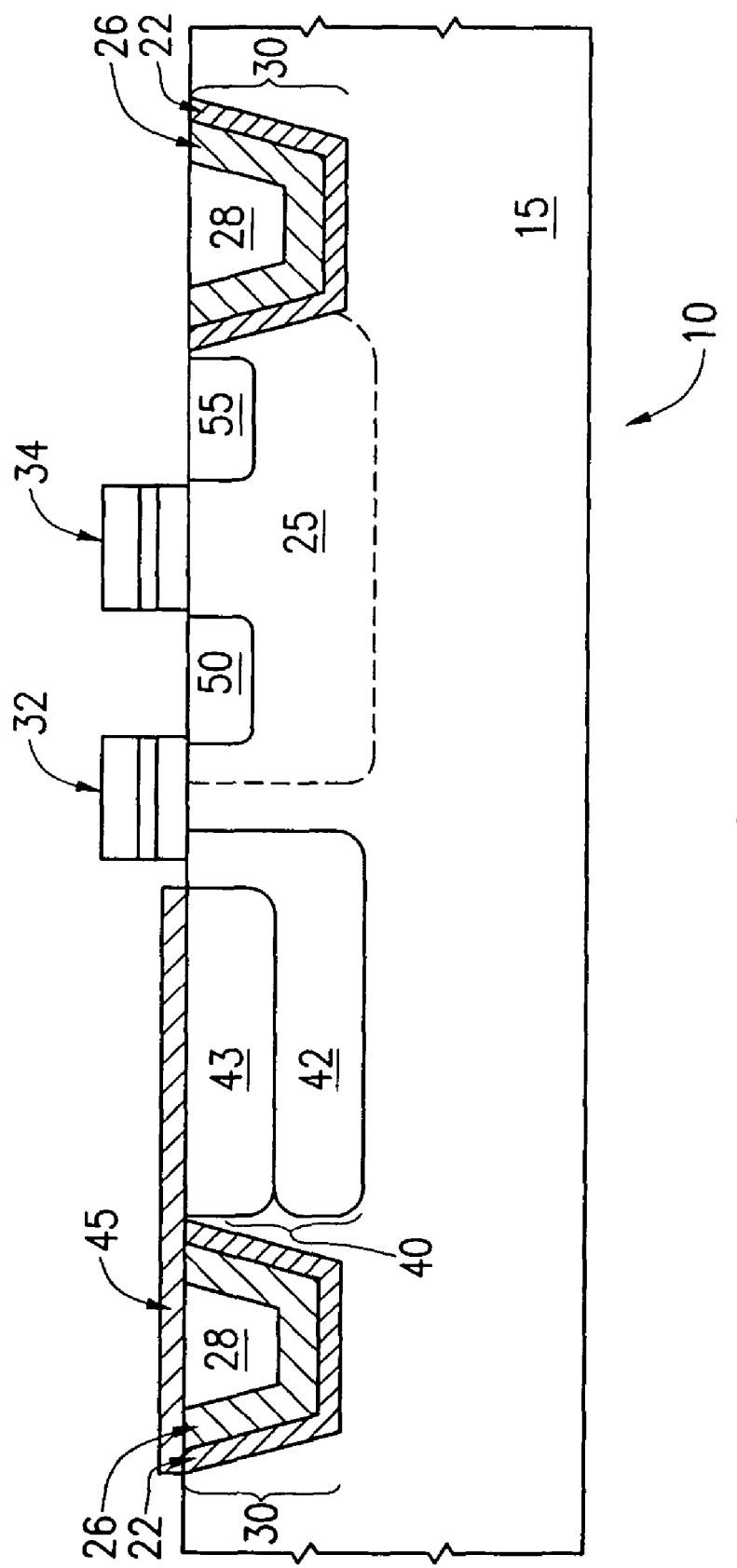
FIG. 15 is an illustration of the pixel cell of FIG. 14 at a subsequent stage of fabrication.

Referring to FIG. 15, a layer of silicon dioxide 45 is grown on the surface of the substrate 15 and etched back such that it remains only over the STI region 30 and photodiode 40. As with silicon dioxide layer 22, layer 45 may be optionally removed. By forming a silicon dioxide layer over a silicon substrate and subsequently removing it, the silicon dioxide heals defects in the surface of the substrate, providing a more uniform surface. Therefore, while the embodiment having the silicon dioxide layer 45 removed would not provide the same dielectric properties as an embodiment keeping the layer 45, it would still have the benefits of providing a substrate surface which is essentially free of defects. For the purposes of illustration, the embodiment without removing silicon dioxide layer 45 shall be discussed herein.

Figure 16:
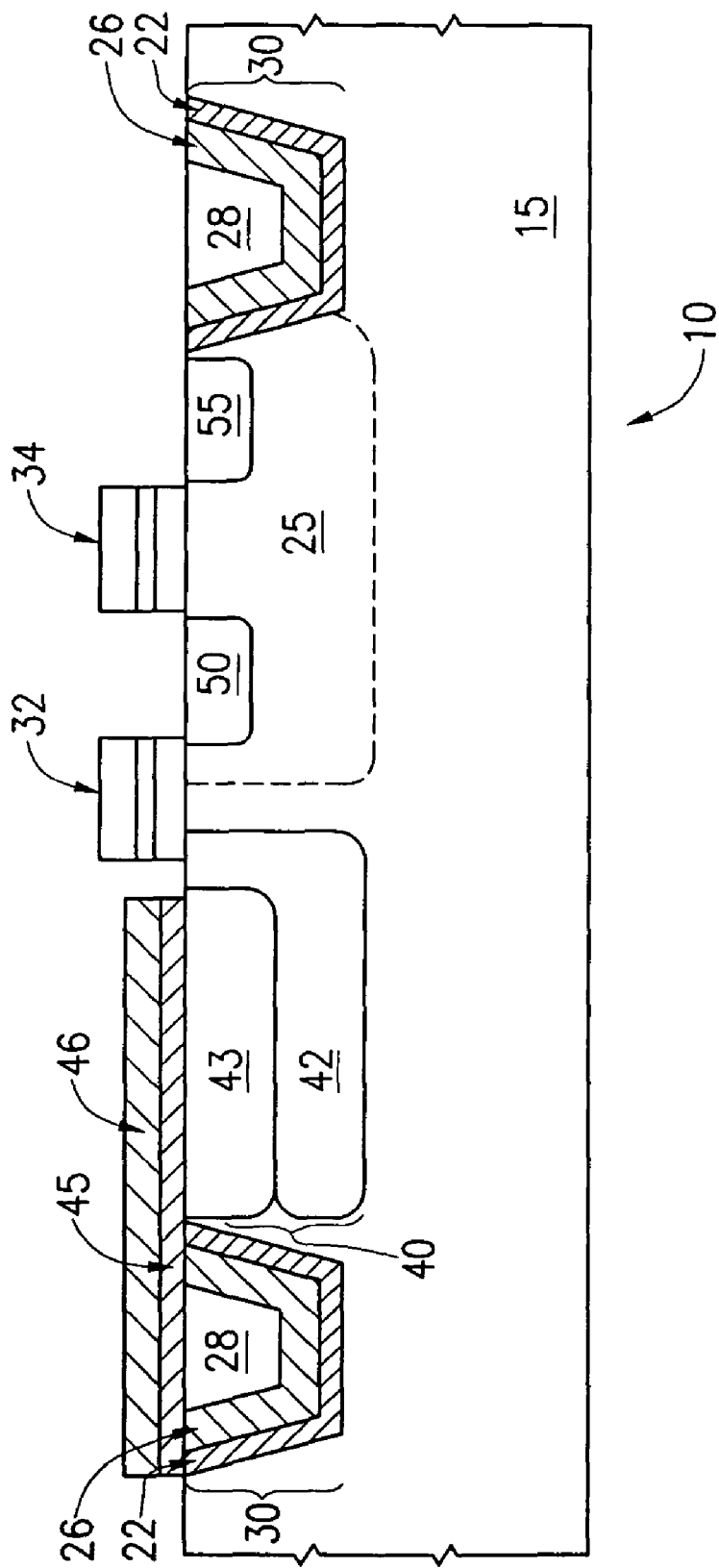
FIG. 16 is an illustration of the pixel cell of FIG. 15 at a subsequent stage of fabrication.

Referring to FIG. 16, a thin aluminum oxide film 46 is selectively deposited over silicon dioxide layer 45 on the surface of the substrate 15, over the STI region 30 and photodiode 40, by methods such as chemical vapor deposition, atomic layer deposition, plasma vapor deposition, or other suitable techniques. The aluminum oxide film 46 may be deposited to a thickness within the range of about 30 Å to about 500 Å, preferably about 50 Å. A photo step may remove any excess aluminum oxide film from surfaces other than the tops of the STI region 30 and the photodiode 40. Although the aluminum oxide film 46 is described as being deposited after the formation of the photodiode 40, it may also be deposited before or after the formation of the photodiode 40, depending on desired sequence of processing.

The high-k dielectric films (e.g., aluminum oxide, aluminum nitride, silicon-rich aluminum oxides) create a very shallow accumulation layer over the photodiode 40 and near the sidewalls of the STI region 30. Aluminum oxide induces an excess negative charge in the sidewalls of the STI region 30 and above the photodiode 40. Negative charge in these regions results in hole accumulation in the p-type regions of the substrate. This electrically disconnects the photodiode 40 from the bulk substrate 15, preventing depletion of the substrate 15 and excessive leakage.

Figure 17:
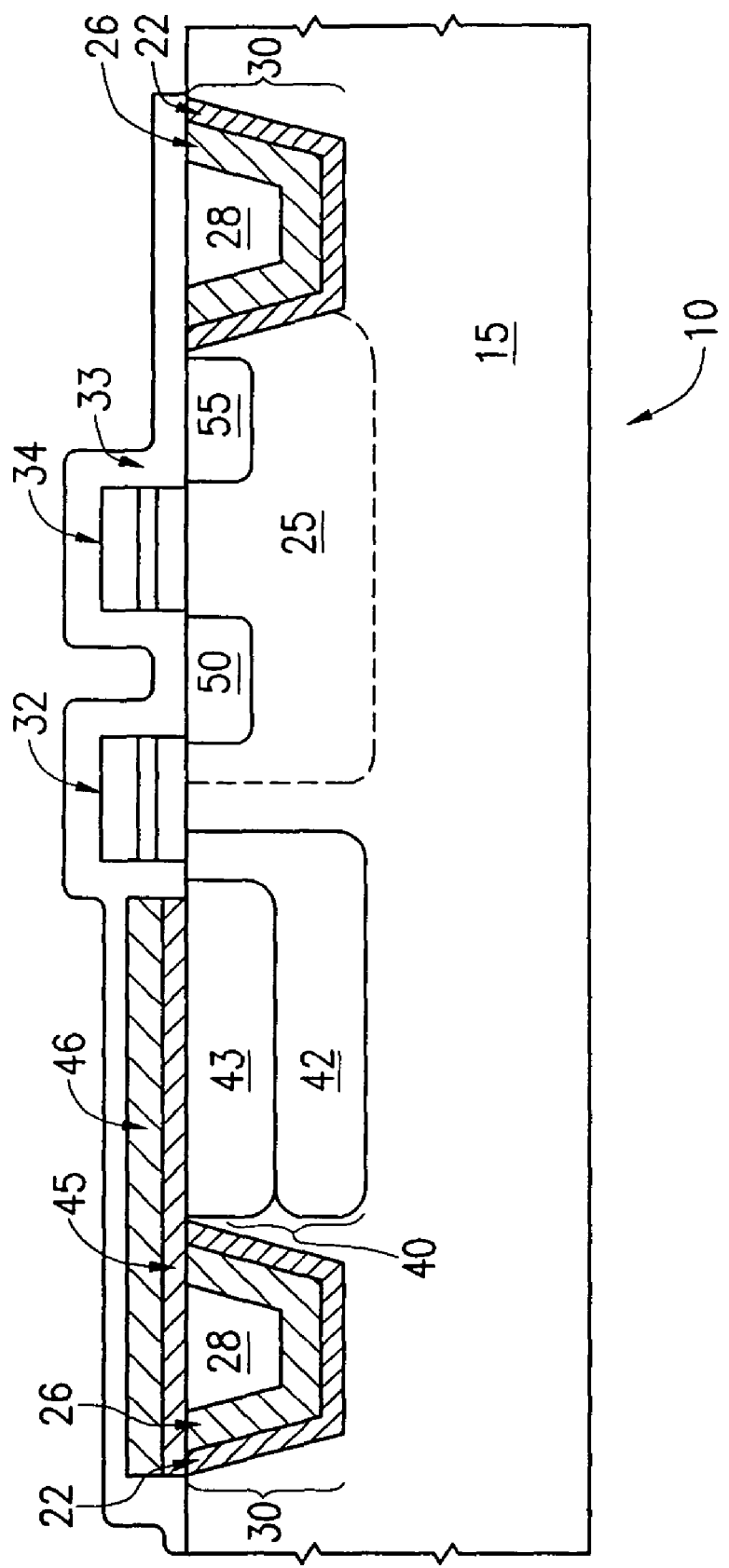
FIG. 17 is an illustration of the pixel cell of FIG. 16 at a final stage of fabrication.

A spacer insulating layer 33 (FIG. 17) is deposited over the pixel cell 10 and other conventional processing steps, such as conductive line formation to pixel cell 10, may follow.

Although the above embodiments have been described with reference to the formation of n-channel devices, it must be understood that the invention is not limited to this embodiment. Accordingly, the invention has equal applicability to p-channel devices formed within an n-type substrate 15. In such an embodiment the conductivity types of all structures changes accordingly. For example, in FIG. 17, aluminum oxide layers 26,46 are replaced with layers 26, 46, having excess positive charge (e.g., silicon nitride), to induce electron-rich accumulation regions in the n-type region 43 and the n-type substrate 15 surrounding the p-type region 42 of the photodiode 40.

Figure 1:
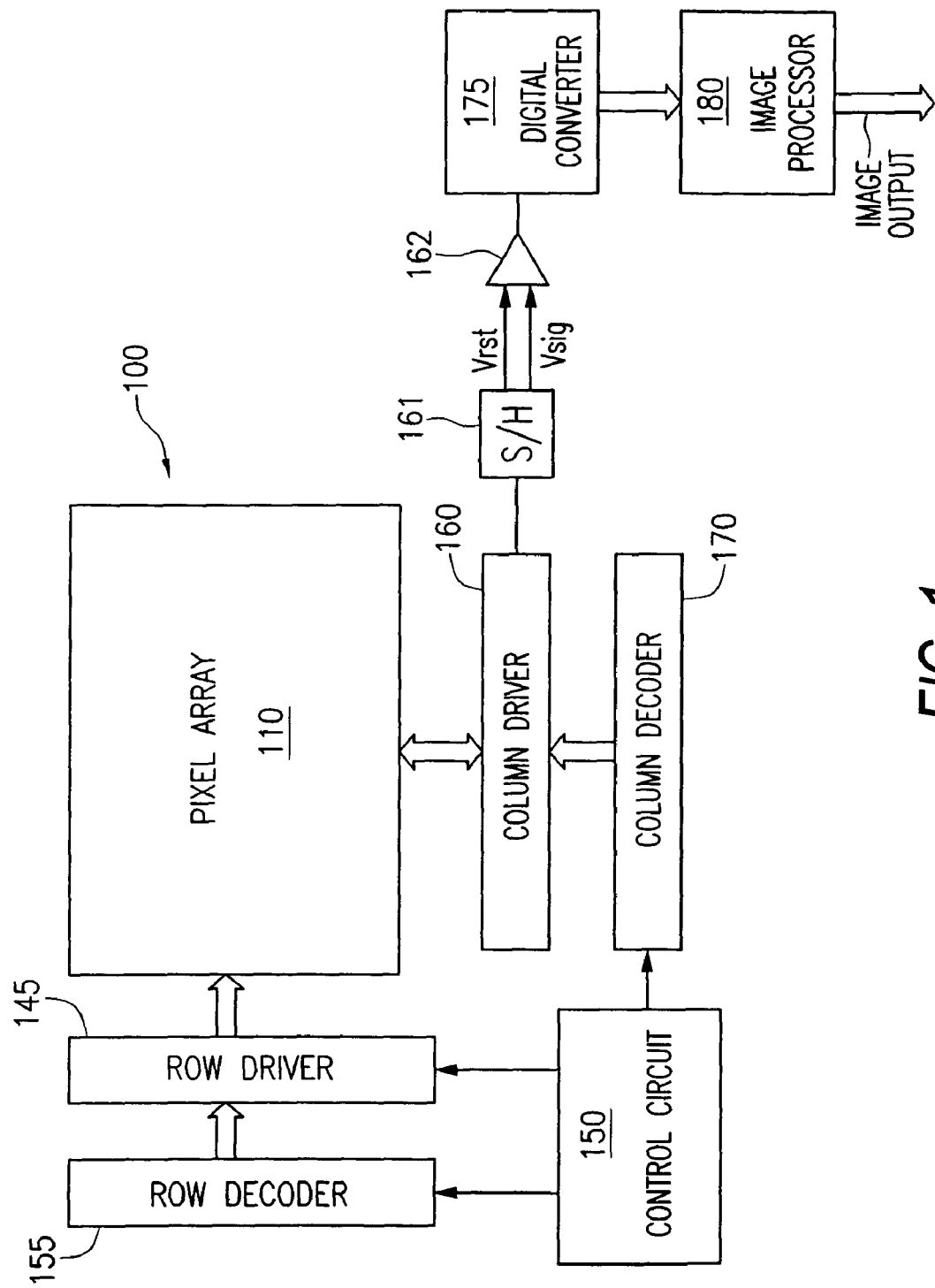
FIG. 1 is a block diagram of an imaging device.
Figure 2:
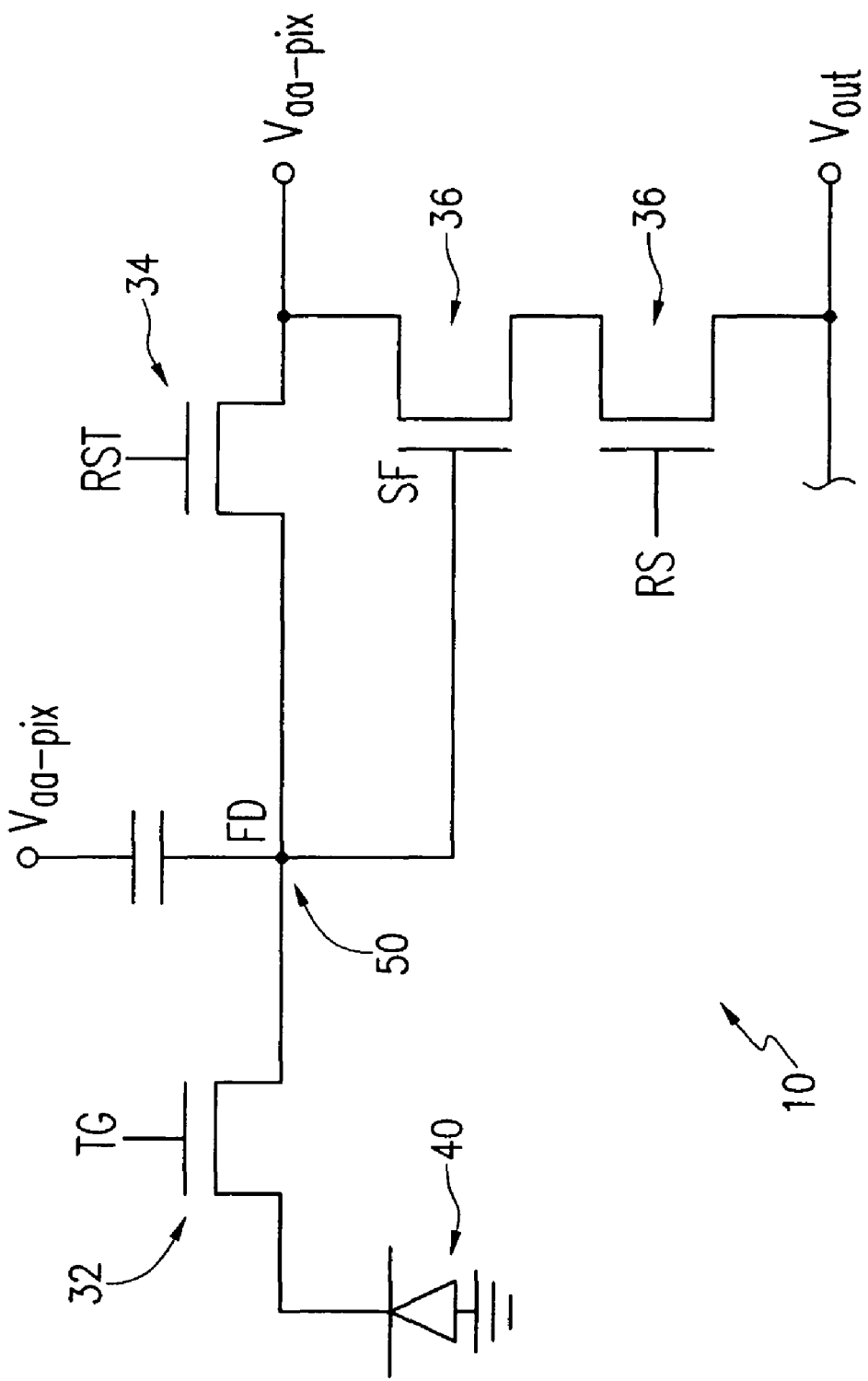
FIG. 2 is a schematic diagram of a four-transistor (4T) pixel.
Figure 18:
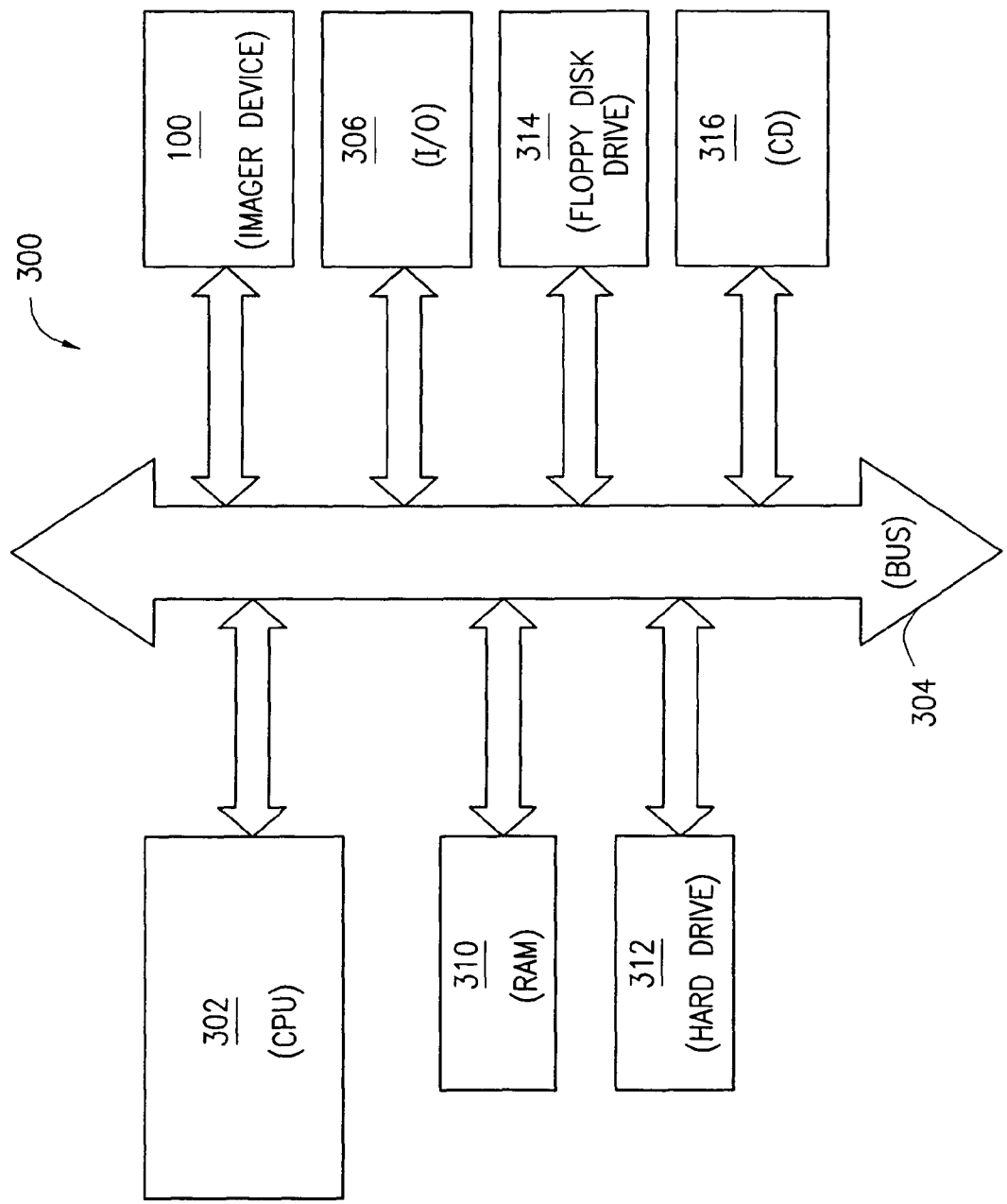
FIG. 18 shows a processor system incorporating at least one imager device constructed in accordance with an embodiment of the invention.

FIG. 18 shows a system 300, a typical processor-based system modified to include an imager device 100, as in FIG. 1, employing pixels of the present invention. Examples of processor-based systems, which may employ the imager device 100, include, without limitation, computer systems, camera systems, scanners, machine vision systems, vehicle navigation systems, video telephones, surveillance systems, auto focus systems, star tracker systems, motion detection systems, image stabilization systems, and others.

System 300 includes a central processing unit (CPU) 302 that communicates with various devices over a bus 304. Some of the devices connected to the bus 304 provide communication into and out of the system 300, illustratively including an input/output (I/O) device 306 and imager device 100. Other devices connected to the bus 304 provide memory, illustratively including a random access memory system (RAM) 310, hard drive 312, and one or more peripheral memory devices such as a floppy disk drive 314 and compact disk (CD) drive 316. The imager device 100 may be combined with a processor, such as a CPU, digital signal processor, or microprocessor, in a single integrated circuit. The imager device 100 may be a CCD imager or CMOS imager constructed in accordance with any of the illustrated embodiments.

The above description and drawings are only to be considered illustrative of exemplary embodiments which achieve the features and advantages of the invention. Modification of, and substitutions to, specific process and conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A pixel cell comprising:
    a photodiode in a substrate, the photodiode comprising a top region, a middle region, and a bottom region connected to the top region through an n-type intermediate region wherein the middle region is a p-type material and the top and bottom are n-type material; and
    a first high-k dielectric material having excess positive charge over the top n-type region to provide electron accumulation in the top region and intermediate region.

2. The pixel cell of claim 1, wherein a second high-k dielectric material is provided in a trench.

3. The pixel cell of claim 2, wherein the trench is filled with the second high-k dielectric material which comprises silicon nitride.

4. The pixel cell of claim 1, wherein the first high-k dielectric material comprises silicon nitride.

5. The pixel cell of claim 1, wherein the first high-k dielectric material prevents a depletion region of the photodiode from reaching a top surface of the substrate.

6. A pixel cell comprising:
    a photodiode comprising a p-type charge-collection region, top accumulation region, bottom accumulation region and side accumulation region, wherein each of the top accumulation region, bottom accumulation region, and side accumulation region are n-type and adjacent the p-type charge-collection region; and
    an isolation structure comprising;
        a trench containing a first high-k dielectric material having excess positive charge, the trench being adjacent the side n-type accumulation region, wherein the excess positive charge of the first high-k dielectric material causes electron accumulation in the side n-type accumulation region; and
        a second high-k dielectric material having excess positive charge residing over the trench and the photodiode, wherein the excess positive charge of the second high-k dielectric material causes electron accumulation in the top n-type accumulation region.

7. The pixel cell of claim 6, wherein the trench of the isolation structure has at least a bottom and sidewalls.

8. The pixel cell of claim 6, wherein the trench has a depth between about 1000 Å and about 4000 Å.

9. The pixel cell of claim 6, wherein the trench has a depth between about 1500 Å and about 3000 Å.

10. The pixel cell of claim 6, wherein the trench has a width between about 500 Å and about 10000 Å.

11. The pixel cell of claim 6, wherein the trench has a width between about 1000 Å and about 3000 Å.

12. The pixel cell of claim 6 wherein the isolation structure further comprises a silicon dioxide layer between the walls of the trench and the first high-k dielectric material.

13. The pixel cell of claim 6 wherein the first and second high-k dielectric materials are silicon nitride.

14. The pixel cell of claim 6 further comprising an insulating material between the trench wall and the first high-k dielectric material.

15. The pixel cell of claim 14 wherein the insulating material is selected from the group consisting of silicon dioxide, oxide-nitride, nitride-oxide, and oxide-nitride-oxide.

16. The pixel cell of claim 6 further comprising silicon dioxide over the top n-type accumulation region.

17. The pixel cell of claim 6 wherein the second high-k dielectric material resides exclusively over the trench and the photodiode.

18. The pixel cell of claim 6 further comprising a spacer insulating layer formed over the trench and the photodiode.

* * * * *

UNITED STATES PATENT AND TRADEMARK OFFICE
CERTIFICATE OF CORRECTION

PATENT NO. : 7,741,660 B2 Page 1 of 1
APPLICATION NO. : 11/636564
DATED : June 22, 2010
INVENTOR(S) : Chandra Mouli It is certified that error appears in the above-identified patent and that said Letters Patent is hereby corrected as shown below:

In column 8, line 25, in Claim 1, after "bottoms" insert -- regions --.

Signed and Sealed this

Seventeenth Day of August, 2010

David J. Kappos
*Director of the United States Patent and Trademark Office*